United States Patent [19]

Ito

[11] Patent Number: 4,707,725

[45] Date of Patent: Nov. 17, 1987

[54] FLUORESCENT COATING FOR UV SENSITIVE SEMICONDUCTOR DEVICE

[75] Inventor: Eizo Ito, Itami, Japan

[73] Assignee: Mitsubishi Denki Kabushiki Kaisha, Tokyo, Japan

[21] Appl. No.: 900,441

[22] Filed: Aug. 26, 1986

[30] Foreign Application Priority Data

Sep. 30, 1985 [JP] Japan ................................ 60-219397

[51] Int. Cl.$^4$ ...................... H01L 23/30; H01L 23/28
[52] U.S. Cl. .................................... 357/72; 357/23.5; 357/29; 357/74; 365/184; 365/185; 174/52 PE
[58] Field of Search .................... 357/72, 74, 23.5, 29; 365/184, 185; 174/52 PE

[56] References Cited

FOREIGN PATENT DOCUMENTS

| | | | |
|---|---|---|---|
| 57-30351 | 2/1982 | Japan | ................................ 357/72 |
| 58-106851 | 6/1983 | Japan . | |
| 58-200558 | 11/1983 | Japan | ................................ 357/72 |
| 60-83351 | 5/1985 | Japan | ................................ 357/72 |

Primary Examiner—Andrew J. James
Assistant Examiner—Jerome Jackson
Attorney, Agent, or Firm—Lowe, Price, LeBlanc, Becker & Shur

[57] ABSTRACT

A package for an EPROM provided with an ultraviolet-ray generating layer formed on the surface of an EPROM semiconductor chip to be excited by X-rays or gamma rays to generate ultraviolet rays, and both of the semiconductor chip and the ultraviolet-ray generating layer being sealed with a synthetic resin layer transmitting X-rays or gamma rays.

9 Claims, 4 Drawing Figures

FLUORESCENT COATING FOR UV SENSITIVE SEMICONDUCTOR DEVICE

BACKGROUND OF THE INVENTION

1. Field of the Invention

The present invention relates to a semiconductor device, and more particularly, it relates to a package for an electrically programmable read-only memory erasable with ultraviolet rays.

2. Description of the Prior Art

FIG. 1 is a sectional view schematically showing the entire structure of a conventional semiconductor device including an electrically programmable read-only memory erasable with ultraviolet rays which is disclosed in, e.g., Japanese Patent Laying-Open Gazette No. 83351/1985. Referring to FIG. 1, the conventional semiconductor device including an electrically programmable read-only memory erasable with ultraviolet rays (hereinafter referred to as "EPROM") comprises an EPROM semiconductor chip 4 mounted on a lead frame and having an ultraviolet-irradiated surface upwardly directed, an ultraviolet-ray transmitting resin layer 6 formed on the EPROM semiconductor chip 4 for transmitting supplied ultraviolet rays, an ultraviolet-ray transmitting window 7 formed on the ultraviolet-ray transmitting resin layer 6 for introducing ultraviolet rays supplied from the exterior, an external lead wire 2 connected with the EPROM semiconductor chip 4 through a metal fine line 3 to serve as an input/output terminal for signals and synthetic resin layer 1 for protecting the semiconductor chip 4 against the environment or the like. Description is now made on memory erasing operation for erasing data stored in the EPROM as shown in FIG. 1.

In the semiconductor device as shown in FIG. 1, ultraviolet rays are directly applied to the EPROM semiconductor chip 4 from the exterior through the ultraviolet-ray transmitting window 7. The ultraviolet-ray transmitting resin layer 6 is adapted to prevent entrance of synthetic resin not transmitting ultraviolet rays into a space between the ultraviolet-ray transmitting window 7 and the EPROM semiconductor chip 4. In response to the supplied ultraviolet rays, the EPROM erases electrically written storage data. Detailed description of operation (e.g., discharge of charges from a floating gate) for erasing the storage data in the EPROM is omitted.

The semiconductor device as shown in FIG. 1 must be provided with the ultraviolet-ray transmitting window and the ultraviolet-ray transmitting resin layer, and hence assembling steps are complicated and it has been difficult to implement such a semiconductor device at a cost substantially identical to that of an ordinary semiconductor device sealed with synthetic resin. Further, the ultraviolet-ray transmitting window is not made of synthetic resin, and hence it allows entrance of moisture through its exposed interface, to be inferior in moisture resistance.

FIG. 2 schematically illustrates the structure of a non-rewritable PROM semiconductor device formed by an EPROM semiconductor chip sealed with only general synthetic resin having no ultraviolet-ray transmittivity. Referring to FIG. 2, the conventional non-rewritable PROM comprises a semiconductor chip 4 mounted on a lead frame, an external lead wire 2 connected with the semiconductor chip 4 through a metal fine line 3 to serve as an input/output terminal for signals and synthetic resin layer 1 for sealing the lead frame, the semiconductor chip 4 and the metal fine line 3. In the semiconductor device as shown in FIG. 2, memory erasability of the EPROM is aborted and the semiconductor chip 4 is sealed with the low-priced synthetic resin layer 1 transmitting no ultraviolet rays, thereby to realize a low cost. In this semiconductor device, the sealing resin material, i.e., the package 1 of synthetic resin has no ultraviolet-ray transmittivity, and hence storage data (memory contents) once electrically written in the PROM cannot be erased.

In the conventional semiconductor device as shown in FIG. 2, the sealing resin material does not transmit ultraviolet rays and hence the memory contents cannot be erased, whereby the function of the semiconductor device cannot be sufficiently tested in advance to delivery.

The aforementioned package for an EPROM having an ultraviolet-ray transmitting window is described in U.S. Pat. No. 4,460,915 entitled "A Plastic Package for a Radiation Sensitive Semiconductor Device," granted to Paul R. Engel.

SUMMARY OF THE INVENTION

It is an object of the present invention to overcome the aforementioned disadvantages and provide a highly reliable semiconductor device having erasable memory contents and being excellent in moisture resistance at a low cost.

The semiconductor device according to the present invention comprises an ultraviolet-ray generating layer provided on an ultraviolet-irradiated surface of an EPROM semiconductor chip to generate ultraviolet rays in response to high energy rays and a synthetic resin layer transmitting the energy rays adapted to cover the semiconductor chip and the ultraviolet-ray generating layer.

The ultraviolet-ray generating layer is preferably in double-layer structure including an ultraviolet-ray transmitting layer formed on the ultraviolet-irradiated surface of the semiconductor chip and a layer containing a fluorescent material excited by energy rays to emit ultraviolet rays formed on the ultraviolet-ray transmitting layer.

The synthetic resin layer for entirely covering the device transmits energy rays such as X-rays. Therefore, when energy rays are externally applied, the ultraviolet-ray generating layer is excited in response to the energy rays to generate ultraviolet rays, which in turn are supplied to the EPROM through the ultraviolet-irradiated surface of the semiconductor chip. Thus, memory contents of the EPROM can be erased.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
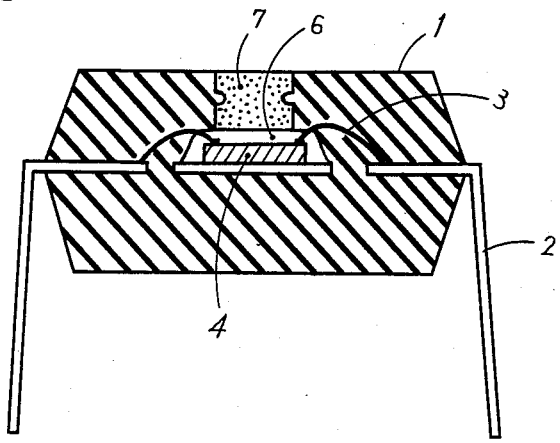
FIG. 1 is a sectional view showing a conventional semiconductor device provided with a plastic package having an ultraviolet-ray transmitting window.
Figure 2:
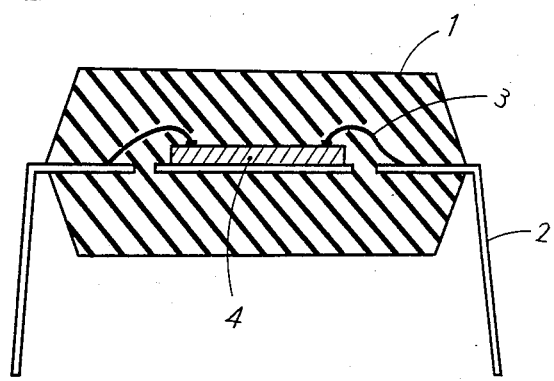
FIG. 2 is a sectional view showing the entire structure of a conventional non-rewritable semiconductor memory device.
Figure 3:
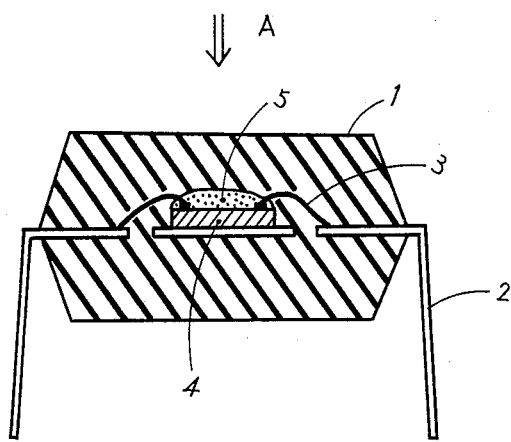
FIG. 3 is a sectional view showing the structure of a semiconductor device according to an embodiment of the present invention.

FIG. 3 is a sectional view schematically showing the structure of a semiconductor device according to an embodiment of the present invention. Referring to FIG. 3, the semiconductor device comprises an EPROM semiconductor chip 4 mounted on a lead frame and having an ultraviolet-irradiated surface upwardly directed, a coating layer 5 formed on the EPROM semiconductor chip 4 to cover the ultraviolet-irradiated surface and containing fluorescent material excited by X-rays to emit ultraviolet rays, an external lead wire 2 connected with the EPROM semiconductor chip 4 through a metal fine line 3 to serve as an input/output terminal for signals, and a synthetic resin layer 1 formed so as to cover the lead frame, the semiconductor chip 4 and the coating layer 5 to serve as a package. The synthetic resin layer 1 for transmitting energy rays is prepared by, e.g., epoxy resin. The fluorescent material enable to be excited by energy rays to emit ultraviolet rays is prepared by, e.g., $BaSi_2O_5:Pb$ or $LaOBr:Tm$.

Description is now made on memory erasing operation of the EPROM in the semiconductor device as shown in FIG. 3.

X-rays are externally applied in the direction shown by an arrow A in FIG. 3. The X-rays can be transmitted through the synthetic resin layer 1 serving as a package, to reach the coating layer 5 containing the fluorescent material formed on the ultraviolet-irradiated surface of the EPROM semiconductor chip 4. The X-rays reaching the coating layer 5 are absorbed by the fluorescent material contained in the coating layer 5. The fluorescent material is excited by the absorbed X-rays and emits ultraviolet rays, to apply the same to the EPROM semiconductor chip 4 through the ultraviolet-irradiated surface. Memory contents of the EPROM on the semiconductor chip 4 are erased in response to the ultraviolet rays.

Figure 4:
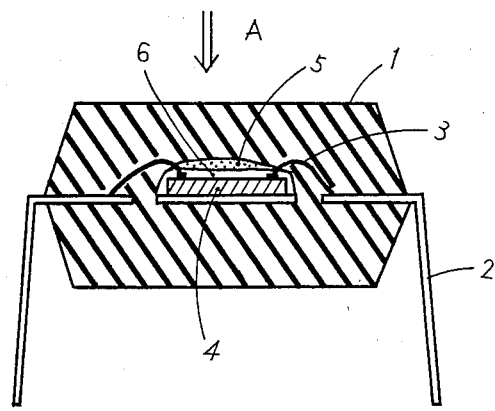
FIG. 4 is a sectional view showing a semiconductor device according to another embodiment of the present invention.

FIG. 4 is a sectional view schematically showing the structure of a semiconductor device according to another embodiment of the present invention. This semiconductor device is different from that shown in FIG. 3 in that an ultraviolet-ray generating layer is in double-layer structure. That is, the ultraviolet-ray generating layer is formed by an ultraviolet-ray transmitting resin layer 6 provided on a semiconductor chip 4 and a coating layer 5 provided on the ultraviolet-ray transmitting layer 6 and containing fluorescent material excited by X-rays to emit ultraviolet rays. The ultraviolet-ray transmitting resin layer 6 is prepared by, e.g., silicone resin.

With such structure, the EPROM can be prevented from bad influence exerted by impurities such as sodium and chlorine contained in the coating layer 5 containing the ultraviolet-ray emitting fluorescent material. Memory erasing operation of the semiconductor device as shown in FIG. 4 is identical to that of the embodiment as shown in FIG. 3.

Although X-rays are employed as energy rays for generating ultraviolet rays in the above description, the energy rays are not restricted to the same, and other energy rays such as gamma rays may be employed to attain a similar effect.

According to the present invention as hereinabove described, an ultraviolet-ray generating layer is provided on a semiconductor chip and a synthetic resin layer transparent to energy rays is formed to cover the semiconductor chip and the ultraviolet-ray generating layer, whereby no ultraviolet-ray transmitting window is required and assembling steps are simplified while the cost for the material of the package is saved, to implement the semiconductor device at a low cost.

Further, no interface is defined with respect to the synthetic resin layer since no ultraviolet-ray transmitting window is required, whereby characteristics such as moisture resistance are improved to implement a highly reliable semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including an erasable programmable read-only memory whose storage contents are erased by ultraviolet rays supplied through an ultraviolet-irradiated surface, said semiconductor device comprising:

a semiconductor chip provided thereon with said programmable read-only memory erasable with ultraviolet rays and having said ultraviolet-irradiated surface;

an ultraviolet-ray generating layer formed on said ultraviolet-irradiated surface for generating ultraviolet rays in response to externally supplied energy rays to supply the same to said ultraviolet-irradiated surface; and a synthetic resin layer provided to cover said semiconductor chip and said ultraviolet-ray generating layer for transmitting said externally supplied energy rays.

2. A semiconductor device in accordance with claim 1, wherein
said ultraviolet-ray generating layer is formed by a layer containing fluorescent material which can be excited by said externally supplied energy rays to generate ultraviolet rays.

3. A semiconductor device in accordance with claim 2, wherein
said ultraviolet ray generating layer further includes an ultraviolet-ray transmitting layer formed between said layer containing said fluorescent material and said ultraviolet-irradiated surface of said semiconductor chip.

4. A semiconductor device in accordance with claim 1, wherein
said synthetic resin layer is prepared by epoxy resin.

5. A semiconductor device in accordance with claim 2, wherein
said fluorescent material for generating ultraviolet rays is $BaSi_2O_5:Pb$.

6. A semiconductor device in accordance with claim 2, wherein
said fluorescent material for generating ultraviolet rays is $LaOBr:Tm$.

7. A semiconductor device in accordance with claim 3, wherein said ultraviolet-ray transmitting layer is prepared by silicone resin.

8. A semiconductor device in accordance with claim 1, wherein said energy rays are X-rays.

9. A semiconductor device in accordance with claim 1, wherein said energy rays are gamma rays.

* * * * *